(12) United States Patent
Gao

(10) Patent No.: US 11,089,715 B2
(45) Date of Patent: Aug. 10, 2021

(54) COOLING CHASSIS DESIGN FOR SERVER LIQUID COOLING OF ELECTRONIC RACKS OF A DATA CENTER

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/573,812

(22) Filed: Sep. 17, 2019

(65) Prior Publication Data

US 2021/0084793 A1    Mar. 18, 2021

(51) Int. Cl.
*H05K 7/20* (2006.01)

(52) U.S. Cl.
CPC ..... *H05K 7/20281* (2013.01); *H05K 7/20172* (2013.01); *H05K 7/20772* (2013.01); *H05K 7/2079* (2013.01)

(58) Field of Classification Search
CPC ........... H05K 7/20281; H05K 7/20772; H05K 7/20172; H05K 7/2079; H05K 7/20218; H05K 7/20254; H05K 7/2029; H05K 7/20318; H05K 7/20672; H05K 7/20681; H05K 7/20809; H05K 7/20818
USPC .................. 361/679.47, 698–702
See application file for complete search history.

(56) References Cited

U.S. PATENT DOCUMENTS

| | | | | |
|---|---|---|---|---|
| 7,957,132 B2* | 6/2011 | Fried | .................. | F28D 15/0266 361/679.47 |
| 8,077,463 B2* | 12/2011 | Lee | ...................... | H01L 23/467 361/700 |
| 10,091,913 B2* | 10/2018 | Shimasaki | ......... | H05K 7/20781 |
| 2003/0057546 A1* | 3/2003 | Memory | ............... | F28D 7/0025 257/706 |
| 2003/0147214 A1* | 8/2003 | Patel | ...................... | G06F 1/206 361/699 |
| 2004/0250992 A1* | 12/2004 | Aoki | .................. | H05K 7/20727 165/80.3 |
| 2005/0024831 A1* | 2/2005 | Phillips | ................. | F28D 15/043 361/700 |
| 2007/0091570 A1* | 4/2007 | Campbell | ............ | H05K 7/2079 361/699 |
| 2009/0027856 A1* | 1/2009 | McCoy | ..................... | G06F 1/20 361/699 |

(Continued)

*Primary Examiner* — Stephen S Sul
(74) *Attorney, Agent, or Firm* — Womble Bond Dickinson (US) LLP

(57) ABSTRACT

An electronic rack includes a number of server chassis arranged in a stack. Each server chassis includes one or more servers and each server includes one or more processors. The electronic rack further includes a number of cooling chassis corresponding to the server chassis. Each cooling chassis is configured to provide liquid cooling to the processors of the server chassis. The cooling chassis includes a cooling module having one or more cooling devices arranged and positioned vertical aligned with the processors of the corresponding server chassis to extract the heat generated from the processors. The cooling chassis further includes a cooling unit coupled to the cooling modules to form a cooling loop to circulate the cooling liquid between the cooling devices and the cooling unit to cool the cooling liquid carrying the heat extracted from the cooling devices. A natural convection cooling loop is assembled and adapted on the cooling chassis.

20 Claims, 5 Drawing Sheets

(56) References Cited

U.S. PATENT DOCUMENTS

| | | | |
|---|---|---|---|
| 2009/0234705 A1* | 9/2009 | Brunschwiler | H05K 7/20836 62/259.2 |
| 2011/0303394 A1* | 12/2011 | Branton | H05K 7/20254 165/104.33 |
| 2011/0313576 A1* | 12/2011 | Nicewonger | F28D 15/00 700/282 |
| 2013/0105122 A1* | 5/2013 | Campbell | F28D 15/0266 165/104.26 |
| 2014/0085822 A1* | 3/2014 | Campbell | H05K 7/20809 361/700 |
| 2014/0251583 A1* | 9/2014 | Eriksen | F28F 3/12 165/104.33 |
| 2015/0138722 A1* | 5/2015 | French, Jr. | H05K 7/20727 361/679.47 |
| 2016/0242318 A1* | 8/2016 | Krug, Jr. | H05K 7/20772 |
| 2018/0279510 A1* | 9/2018 | Johnson | H05K 7/20772 |
| 2018/0341298 A1* | 11/2018 | Cheng | H05K 7/20818 |

* cited by examiner

COOLING CHASSIS DESIGN FOR SERVER LIQUID COOLING OF ELECTRONIC RACKS OF A DATA CENTER

FIELD OF THE DISCLOSURE

Embodiments of the present invention relate generally to data centers. More particularly, embodiments of the invention relate to a cooling chassis design for liquid cooling of electronic racks in data centers.

BACKGROUND

Thermal management of high power density chips and processors are critical problems, especially with the increasing of power density of high end chips, such as CPUs (central processing units) and GPUs (general-purpose processing units). Cooling devices are utilized in cooling system designs are used for maintaining the thermal conditions of the chips by removing the heat generated by the chips. If the temperature exceeds the limitation of the thermal specification, the chips may not function properly and throttling may happen. In addition, by providing proper or better thermal conditions for the chip when it is working, better performance or less power consumption can be achieved.

Cooling device design is critical. With the increasing of power density, the cooling device design or cooling system design becomes a very challenging problem. It requires the cooling devices to provide higher heat transfer coefficient, low thermal resistance, larger heat transfer area, as well as high reliability and low operating energy cost, as well as the cost. There has been a lack of efficient cooling design for servers cooling within an electronic rack of a data center.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
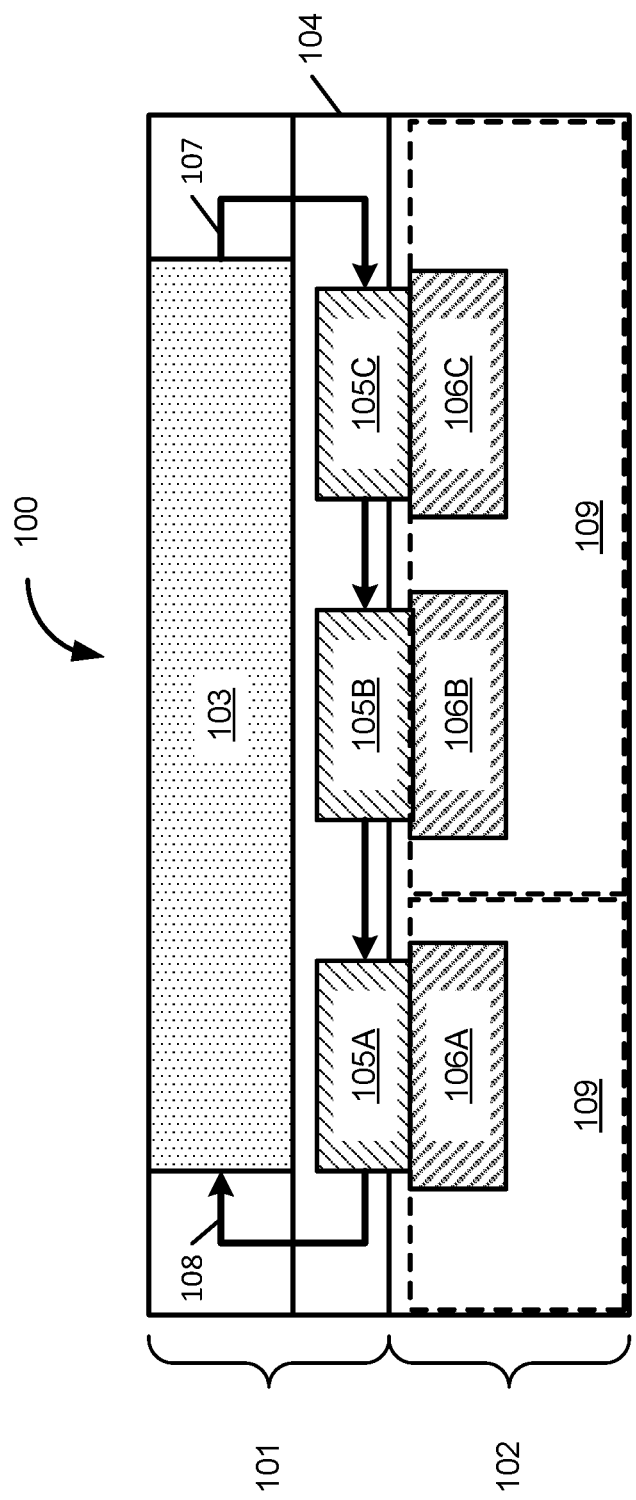
FIG. 1 is a block diagram illustrating an example of a cooling chassis and a server chassis according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present disclosure provide a cooling chassis design that is compatible with the server chassis of an electronic rack used in a data center. The concept can be also extended to other electronics or IT equipment used in automounts vehicles. The cooling chassis provides liquid cooling to one or more servers of the server chassis. The cooling chassis is positioned on top of the corresponding server chassis. The pair of cooling chassis and server chassis can be inserted into any of the slots or shelves of the electronic rack. The cooling chassis further includes a cooling unit and a cooling module, which can be integrated as a single unit or separate units. The cooling chassis includes a liquid supply line and a liquid return line connecting the cooling unit and the cooling module, forming a closed liquid cooling loop. The design can be implemented with different types of cooling solutions with proper designs, such as adding a fluid pump, fan, or other components. The cooling liquid can be single phase cooling liquid or two-phase cooling liquid that can transfer between a liquid state and a vapor state dependent upon the temperature and pressure as a part of thermosiphon natural convection technology.

According to one aspect, an electronic rack includes a number of server chassis arranged in a stack. Each server chassis includes one or more servers and each server includes one or more processors. The electronic rack further includes a number of cooling chassis corresponding to the server chassis. Each cooling chassis is configured to provide liquid cooling to the processors of the server chassis. The cooling chassis includes a cooling module having one or more cooling devices arranged and positioned vertical aligned with the processors of the corresponding server chassis to extract the heat generated from the processors. The cooling chassis further includes a cooling unit coupled to the cooling devices/modules to form a cooling loop to circulate the cooling liquid between the cooling devices and the cooling unit to cool the cooling liquid carrying the heat extracted from the cooling devices.

In one embodiment, each cooling chassis is positioned on top of the corresponding server chassis, such that the cooling devices of the cooling chassis are in contact with the processors of the server chassis. The cooling liquid is circulated between the cooling unit and the cooling devices within the cooling chassis without using external cooling liquid outside of the cooling chassis. The cooling unit includes a liquid-to-air heat exchanger. A cooling device may be a cold plate having a cooling liquid distribution channel disposed therein. The cooling unit may be position above the cooling devices.

In one embodiment, the cooling chassis further includes a liquid supply line extended from the cooling unit to supply cooling liquid to the cooling devices. The cooling chassis further includes a liquid return line extended from the cooling devices back to the cooling unit to circulate the cooling liquid, which may be enforced using a liquid pump disposed within the cooling chassis. The cooling liquid may be single-phase liquid or two-phase liquid that can transform into vapor when the temperature of the cooling liquid is above a first predetermined threshold and transform from the vapor back to the liquid state when the temperature drops below a second predetermined threshold.

According to a further aspect, a cooling chassis shares a similar form factor as a server chassis to be utilized within an electronic rack includes a cooling module and a cooling unit. The cooling module includes one or more cooling devices arranged and positioned vertically aligned with one or more processors of a corresponding server chassis to extract heat generated from the processors. The cooling unit is coupled to the cooling module to form a cooling loop to circulate the cooling liquid between the cooling devices and the cooling unit. The cooling unit is configured to reduce the temperature of the cooling liquid that carries the heat extracted from the cooling devices. The cooling chassis can be inserted into any of the server slots or shelves and position on top of the corresponding server chassis, such that the cooling devices of the cooling chassis are in contact with the exterior surfaces of the processors of the server chassis.

According to another aspect, a data center system includes a number of electronic racks. Each electronic rack includes one or more server chassis and one or more cooling chassis. Each cooling chassis includes a cooling module and a cooling unit as described above.

FIG. 1 is a block diagram illustrating an example of a cooling chassis in view of a sever chassis of an electronic rack according to one embodiment. Referring to FIG. 1, cooling chassis 101 is positioned and attached on top of sever chassis 102 within an electronic rack. Cooling chassis 101 includes cooling unit 103 and cooling module 104. Cooling module 104 includes one or more cooling devices 105A-105C (collectively referred to as cooling devices 105). Sever chassis 102 includes one or more servers 109 and each server 109 includes one or more processors 106A-106C (collectively referred to as processors 106). When cooling chassis 101 is positioned on top of sever chassis 102, cooling devices 105 of cooling module 104 are in contact with processors 106 of server chassis 102 to extract the heat generated from processors 106.

In one embodiment, cooling unit 103 is positioned on top of cooling module 104. Cooling unit 103 is coupled to cooling module via liquid supply line 107 and liquid return line 108 to circulate the cooling liquid between cooling unit 103 and cooling devices 105 of cooling module 104. Liquid supply line 107 is configured to supply the cooling liquid to cooling devices 106, where the cooling liquid has been cooled by cooling unit 103. The cooling liquid travels through each of cooling devices 105 via one or more liquid distribution channels to exchange heat generated from processors 106. Different liquid distribution methods such as in parallel manner, in series manner can be used; fluid distribution devices such as manifold can be assembled in 104. The cooling liquid carrying the exchanged heat is turned back to cooling unit 103 via liquid return line 108 to be cooled by cooling unit 103 again for circulation. Note that the cooling liquid is circulated entirely within cooling chassis 101 without using external cooling liquid or being connected to an external cooling liquid source.

In one embodiment, cooling chassis 101 and server chassis 102 have similar or identical form factor (e.g., similar or identical physical dimension). Cooling chassis 101 can be inserted into any of the server slots or server shelves of an electronic rack. Typically, cooling chassis 101 can be stacked on top of server chassis 102 together. The stacked cooling chassis 101 and server chassis 102 are then inserted into the corresponding slots of the electronic rack.

Figure 2:
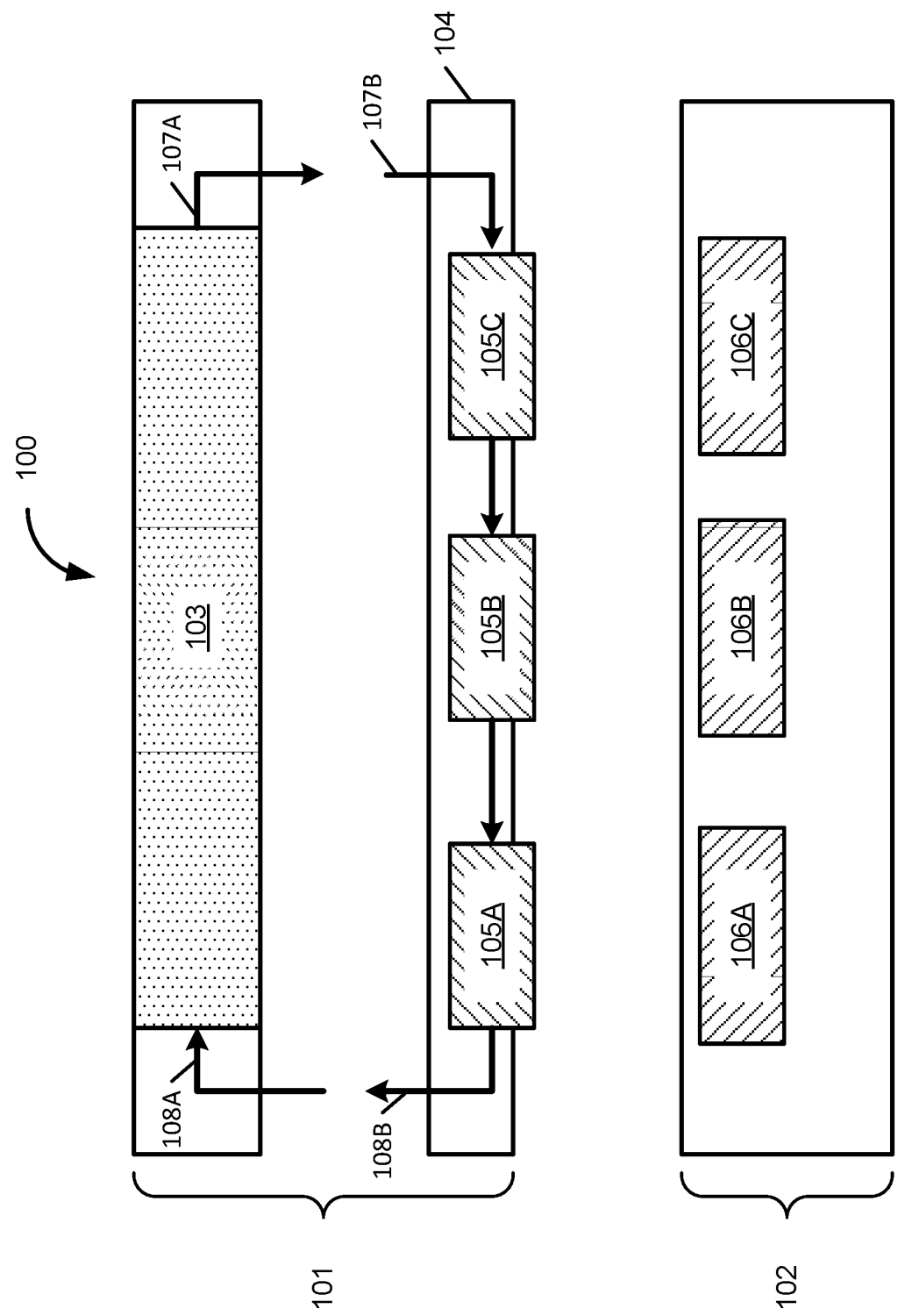
FIG. 2 shows that a cooling chassis and a server chassis in a detached configuration according to one embodiment.

In this example, cooling unit 103 and cooling module 104 are integrated within cooling chassis 101 as a single integrated unit. Alternatively, cooling unit 103 and cooling module 104 can be separate assembled and may be provided by different vendors or manufacturers as shown in FIG. 2. Referring to FIG. 2, cooling unit 103 can be connected to cooling module 104 via counterpart supply lines 107A-107B and return lines 108A-108B. The counterpart supply lines 107A-107B and/or counterpart return lines 108A-108B may be connected using dripless blind mate connectors. Different connecting methods may be applied to the loop 108A, 108B and 107A, 107B based on actual use cases. In one embodiment, in order to more efficiently circulate the cooling liquid, a liquid pump may be disposed within cooling chassis 101.

Figure 3:
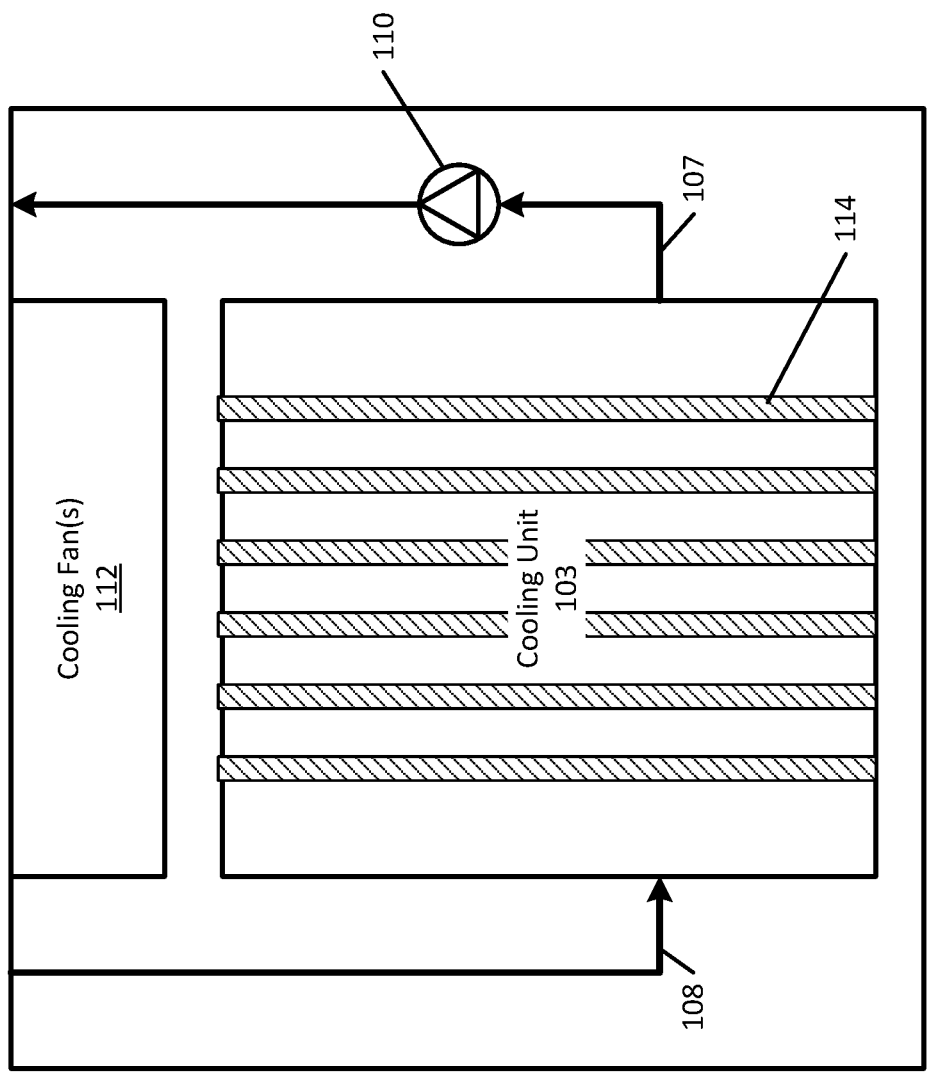
FIG. 3 shows a top view of a cooling chassis according to one embodiment.

FIG. 3 shows a top view of a cooling chassis according to one embodiment. Referring to FIG. 3, in this example, cooling unit 103 may be a heat exchanger, particularly, a liquid-to-air heat exchanger. The cooling liquid is cooled by cooling unit 103 and supplied to cooling devices via liquid supply line 107. The cooling liquid carrying the heat extracted from the cooling devices is returned via liquid return line 108 back to cooling unit. A liquid pump 110 may be disposed on supply line 107 to circulate the cooling liquid or alternatively, it can be disposed on liquid return line 108. In addition, a cooling fan 112 is mounted on the side to provide air cooling to the heat exchanger 103. In one embodiment, the exterior surface of heat exchanger 103 may include a set of fins 114 as part of a heat sink or radiator to radiate the heat with the help of cooling fan 112. In addition, additional functions such as leak detection sensor, fluid sensors and so on can be assembled in this region.

The cooling liquid described above is considered as a single-phase cooling liquid. That is, the cooling liquid would not change its state or form due to its temperature. According to one embodiment, multi-phase cooling liquid can also be utilized as a part of the thermosiphon technology. Two-phase cooling liquid is in a liquid state when the temperature of the cooling liquid is below a first predetermined threshold and it transforms into a vapor state when its temperature is above a second predetermined threshold.

Figure 4:
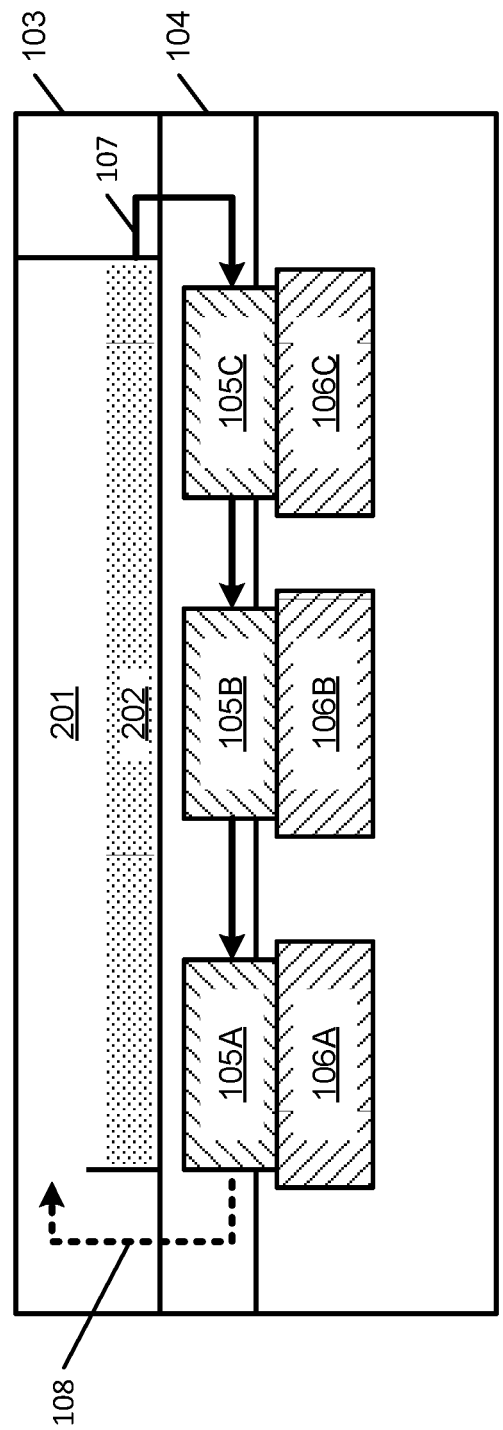
FIG. 4 shows a cooling chassis with thermosiphon technology according to one embodiment.

FIG. 4 is a block diagram illustrating an example of a cooling chassis using thermosiphon technology according to one embodiment. Referring to FIG. 4, in this example, the cooling liquid is two-phase cooling liquid. Cooling unit 103 operates as a condenser to cool and condense the cooling liquid in the vapor state, which transforms back to a liquid state when its temperature drops below a predetermined threshold or due to its density changes, i.e., increases. The cooling liquid in the liquid state is supplied downwardly to cooling devices 105 via the liquid supply line. When the cooling liquid in liquid state flows through each of the cooling devices 105, the cooling liquid transforms from the liquid state to a vapor state. The vapor moves upwardly via a vapor path represented by a dash line into vapor region 201 of cooling unit 103. The vapor is cooled by cooling unit 103, its density increases, transforms from a vapor state to a liquid state, and falls into liquid region 202 due to its gravity and density. The cooling liquid in liquid state is then circulated downwardly to cooling devices 105.

In one embodiment, cooling chassis 101 further includes a heat sink having one or more fins attached to the top surface of the cooling unit. Alternatively, the cover of the cooling unit 103 includes one or more fins integrated thereon. The cooling chassis further includes one or more cooling fans blowing air across the fins to cool the temperature of the container of the cooling unit 103. The cover or container of cooling unit 103 may be made of heat conductive material such as metal.

Figure 5:
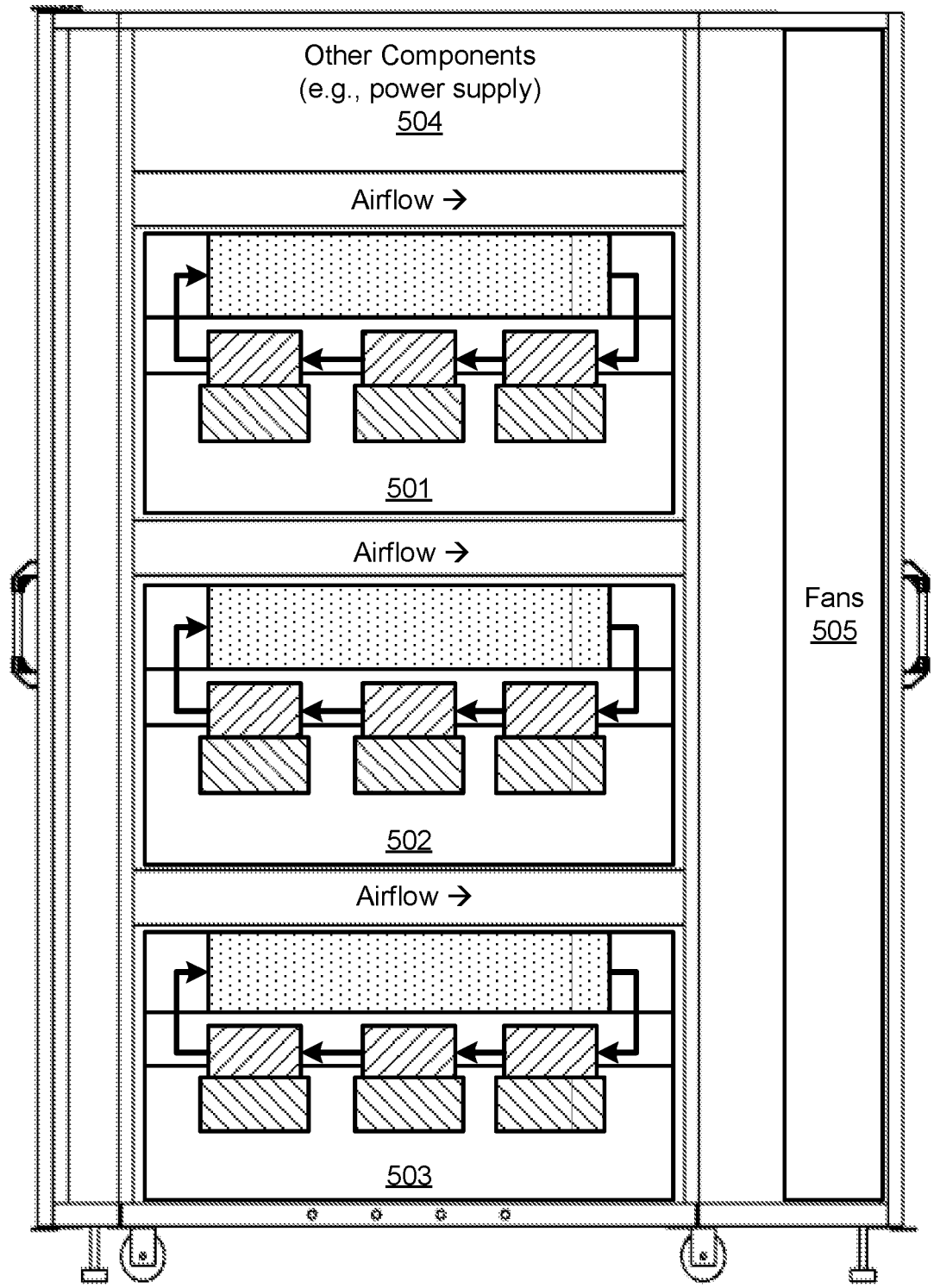
FIG. 5 is a block diagram illustrating an example of an electronic rack according to one embodiment.

FIG. 5 is a block diagram illustrating an example of an electronic rack according to one embodiment. Referring to FIG. 5, electronic rack 500 includes a number of slots or shelves. Each slot can receive a server chassis or a cooling chassis as described above. As described above, a cooling chassis is positioned and attached to the top of a server chassis, before being inserted into a slot. In this example, electronic rack 500 includes bundles 501-503. Each of the bundles 501-503 includes a cooling chassis positioned on top of a server chassis as described above. Electronic rack 500 further includes other components 504 such as a power supply, a backup battery unit, etc. On the backend one or more fans 505 may be utilized to provide air cooling.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack of a data center, comprising:
    a plurality of server chassis arranged in a stack, each server chassis including one or more servers and each server having one or more processors; and
    a plurality of cooling chassis, each cooling chassis corresponding to one of the server chassis, wherein each of the cooling chassis is configured to provide liquid cooling to the one or more processors of a corresponding server chassis, wherein each cooling chassis comprises:
        a cooling module having one or more cooling devices, wherein each of the one or more cooling devices is vertically aligned with, and in contact with, a corresponding one of the one or more processors, and
        a cooling unit coupled to the cooling module to form a cooling loop to circulate cooling liquid between the one or more cooling devices and the cooling unit to cool the cooling liquid carrying heat extracted from the one or more cooling devices, wherein the cooling loop is entirely within the cooling chassis.

2. The electronic rack of claim 1, wherein each cooling chassis is positioned on top of the corresponding server chassis, such that the one or more cooling devices of the cooling chassis are in contact with the one or more processors of the server chassis.

3. The electronic rack of claim 1, wherein the cooling liquid is circulated between the cooling unit and the one or more cooling devices within the cooling chassis, without using external cooling liquid outside of the cooling chassis.

4. The electronic rack of claim 1, wherein the cooling unit comprises a liquid-to-air heat exchanger.

5. The electronic rack of claim 1, wherein at least one of the one or more cooling devices comprises a cold plate.

6. The electronic rack of claim 1, wherein the cooling unit is positioned above the one or more cooling devices.

7. The electronic rack of claim 6, wherein the cooling chassis further comprises:
    a supply line extended from the cooling unit to supply the cooling liquid to the cooling devices to exchange heat generated from the processors of the server chassis; and
    a return line coupled to the cooling devices to return the cooling liquid carrying the heat back to the cooling unit.

8. The electronic rack of claim 7, wherein the cooling liquid is a two-phase cooling liquid, wherein the cooling liquid is in a liquid state flowing through the supply line downwardly and the cooling liquid is in a vapor state flowing through the return line upwardly.

9. The electronic rack of claim 8, wherein the cooling liquid transforms from the liquid state to the vapor state after extracting the heat from the one or more processors, and wherein the cooling liquid transforms from the vapor state to the liquid state after cooling within the cooling unit.

10. The electronic rack of claim 6, wherein an exterior surface of the cooling unit includes one or more fins operating as a heat radiator, and wherein the cooling chassis further comprises a cooling fan blowing air through the fins.

11. The electronic rack of claim 1, wherein each cooling chassis further comprises a liquid pump to circulate the cooling liquid.

12. The electronic rack of claim 1, wherein each cooling chassis has an identical physical form factor as its corresponding server chassis.

13. A data center system, comprising:
    an array of electronic racks, wherein each electronic rack comprises:
        a plurality of server chassis arranged in a stack, each server chassis including one or more servers and each server having one or more processors; and
        a plurality of cooling chassis, each cooling chassis corresponding to one of the server chassis, wherein each of the cooling chassis is configured to provide liquid cooling to the one or more processors of a corresponding server chassis, wherein each cooling chassis comprises:
            a cooling module having one or more cooling devices, wherein each of the one or more cooling devices is vertically aligned with, and in contact with, a corresponding one of the one or more processors, and
            a cooling unit coupled to the cooling module to form a cooling loop to circulate cooling liquid between the one or more cooling devices and the cooling unit to cool the cooling liquid carrying heat extracted from the one or more cooling devices, wherein the cooling loop is entirely within the cooling chassis.

14. The data center system of claim 13, wherein each cooling chassis is positioned on top of the corresponding server chassis, such that the one or more cooling devices of the cooling chassis are in contact with the one or more processors of the server chassis.

15. The data center system of claim 13, wherein the cooling liquid is circulated between the cooling unit and the one or more cooling devices within the cooling chassis, without using external cooling liquid outside of the cooling chassis.

16. The data center system of claim 13, wherein the cooling unit comprises a liquid-to-air heat exchanger.

17. The data center system of claim 13, wherein at least one of the one or more cooling devices comprises a cold plate.

18. A cooling chassis of an electronic rack having a plurality of server chassis, the cooling chassis comprising:
    a cooling module having one or more cooling devices, wherein each of the one or more cooling devices is vertically aligned with, and in contact with, a corresponding one of one or more processors; and
    a cooling unit coupled to the cooling module to form a cooling loop to circulate cooling liquid between the one or more cooling devices and the cooling unit to cool the cooling liquid carrying heat extracted from the one or more cooling devices, wherein the cooling chassis can be inserted into any of a plurality of server slots and positioned on top of a corresponding server chassis, such that the one or more cooling devices of the cooling chassis are in contact with the one or more processors of the server chassis, and wherein the cooling loop is entirely within the cooling chassis.

19. The cooling chassis of claim 18, wherein the cooling chassis has an identical form factor as the corresponding server chassis.

20. The cooling chassis of claim 18, wherein the cooling liquid is circulated between the cooling unit and the one or more cooling devices within the cooling chassis, without using external cooling liquid outside of the cooling chassis.

* * * * *